US012573254B2

(12) United States Patent
Huber

(10) Patent No.: US 12,573,254 B2
(45) Date of Patent: Mar. 10, 2026

(54) SENSOR ELEMENT, TEST DEVICE AND METHOD FOR TESTING DATA CARRIERS HAVING A SPIN RESONANCE FEATURE

(71) Applicant: GIESECKE+DEVRIENT CURRENCY TECHNOLOGY GMBH, Munich (DE)

(72) Inventor: Stephan Huber, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 166 days.

(21) Appl. No.: 18/552,579

(22) PCT Filed: Mar. 22, 2022

(86) PCT No.: PCT/EP2022/025115

§ 371 (c)(1),
(2) Date: Sep. 26, 2023

(87) PCT Pub. No.: WO2022/199891

PCT Pub. Date: Sep. 29, 2022

(65) Prior Publication Data

US 2024/0161565 A1    May 16, 2024

(30) Foreign Application Priority Data

Mar. 26, 2021    (DE) ..................... 10 2021 001 593.2

(51) Int. Cl.
*G01R 33/34*        (2006.01)
*G01N 24/08*        (2006.01)
(Continued)

(52) U.S. Cl.
CPC .............. *G07D 7/04* (2013.01); *G01N 24/08* (2013.01); *G01R 33/3456* (2013.01)

(58) Field of Classification Search
CPC .......... G07D 7/04; G01N 24/08; G01N 24/10; G01R 33/3456; G01R 33/307; G01R 33/60
See application file for complete search history.

(56) References Cited

U.S. PATENT DOCUMENTS 5,149,946 A * 9/1992 Jerome .................. G06K 7/086
                                                324/318
2004/0106205 A1    6/2004 Stevenson et al.
(Continued)

OTHER PUBLICATIONS

Ellersiek, Dennis, "Entwicklung und Charakterisierung von mikrostrukturierten, Planarspulen fur Kernspinresonanz-Anwendungen" (English: "Development and characterization of microstructured planar coils for nuclear magnetic resonance applications"), RWTH Aachen University, Dissertation, Jan. 1, 2010, 350 pages.

(Continued)

*Primary Examiner* — G.M. A Hyder
(74) *Attorney, Agent, or Firm* — Workman Nydegger

(57)        ABSTRACT

A sensor element for testing a flat data carrier, in particular a banknote, has a spin resonance feature. The sensor element contains a magnetic core having an air gap, into which the flat data carrier can be inserted for testing, an element for generating a static magnetic flux in the air gap, and a resonator for exciting the spin resonance feature of the data carrier to be tested. The resonator is formed by a microstrip line resonator which is arranged in the air gap of the magnetic core and comprises a flat carrier having an upper side and a conducting structure which is arranged on the upper side of the carrier with a characteristic length.

15 Claims, 4 Drawing Sheets

(51) Int. Cl.
    *G01R 33/345*     (2006.01)
    *G07D 7/04*       (2016.01)

(56)            References Cited

U.S. PATENT DOCUMENTS

2005/0270023  A1    12/2005   Freedman
2006/0277749  A1    12/2006   Zhang et al.
2024/0177555  A1*   5/2024   Huber .................... G01R 33/60

OTHER PUBLICATIONS

Ahmad, et al., "Theory, Instrumentation, and Applications of EPR Oximetry", Chemical Reviews, May 12, 2010, pp. 1-65.
Zhang, Xiaoliang et al., "Microstrip RF Surface Coil Design for Extremely High-Field MRI and Spectroscopy", Magnetic Resonance in Medicine, vol. 46, Sep. 1, 2001, pp. 443-450.
German Search Report from corresponding German Patent Application No. DE102021001593.2, Nov. 11, 2021.
International Search Report from corresponding PCT Application No. PCT/EP2022/025115, Jul. 14, 2022.

\* cited by examiner

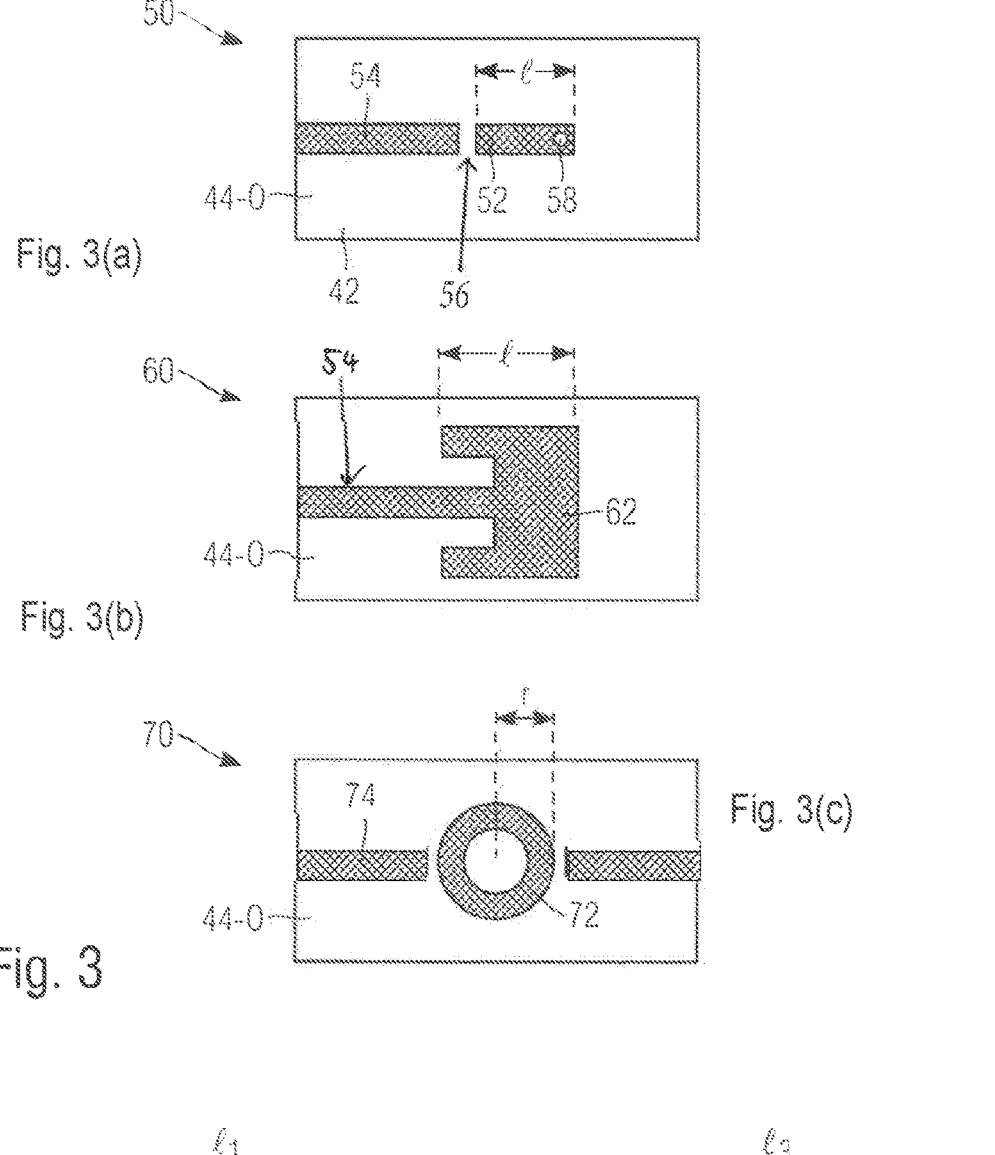
Fig. 3(a)
Fig. 3(b)
Fig. 3(c)
Fig. 3
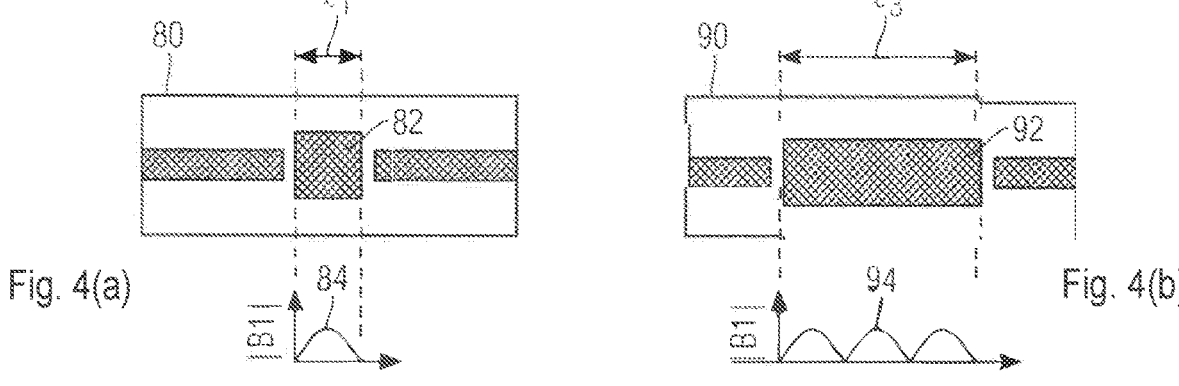
Fig. 4(a)
Fig. 4(b)
Fig. 4

Fig. 6(a)                              Fig. 6(b)

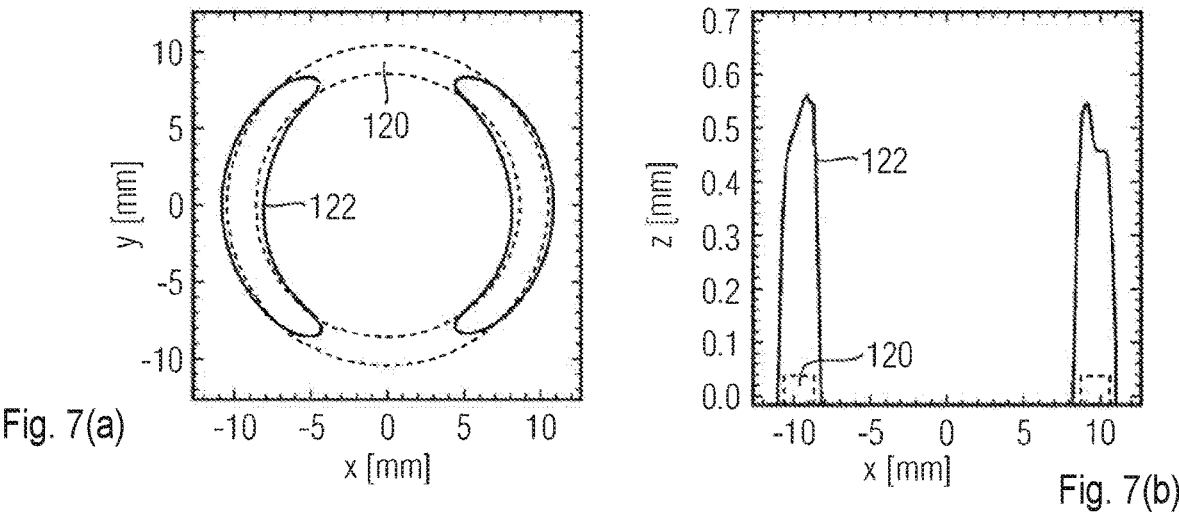
Fig. 7(a)
Fig. 7(b)
Fig. 7
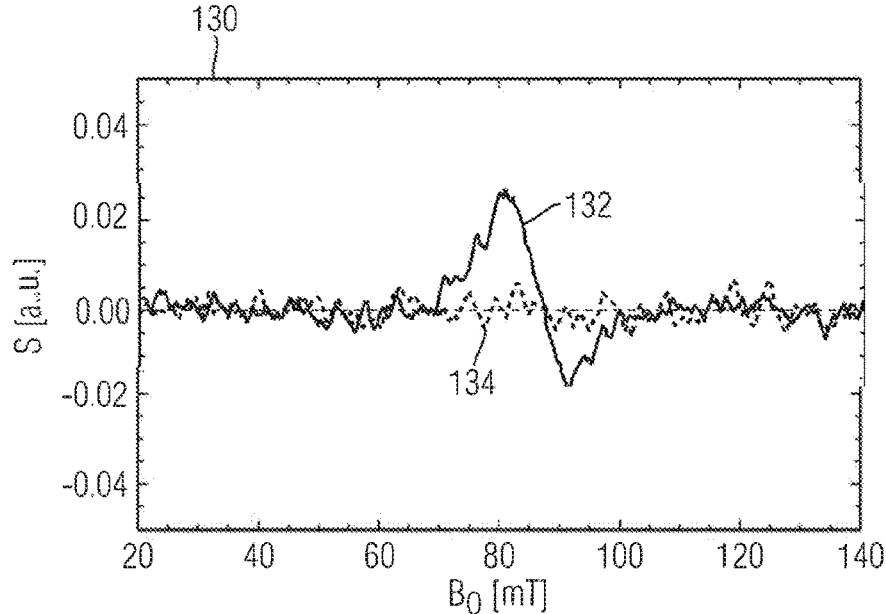
Fig. 8

SENSOR ELEMENT, TEST DEVICE AND METHOD FOR TESTING DATA CARRIERS HAVING A SPIN RESONANCE FEATURE

BACKGROUND

The invention relates to a sensor element for testing a flat data carrier, in particular a banknote, having a spin resonance feature. The invention also relates to a test device having a sensor element of this type, and a method for testing with a sensor element of this type.

Data carriers, such as security documents or identity documents, but also other items of value, such as e.g. branded articles, are often provided with protective security elements which allow the authenticity of the data carriers to be verified and simultaneously offer protection against unauthorized reproduction. In the case of automatic authenticity testing, it is known to use security elements having spin resonance features for the protection of documents and other data carriers. To do this, the security elements are provided with substances which have a spin resonance signature.

Spin resonance features are generally based on a resonant energy absorption of a spin ensemble in an external magnetic field. The resonant energy absorption is physically based on the splitting of the energy states of the spin ensemble in the external magnetic field. Spins, the magnetic moments of which are oriented parallel to the external field, have a lower energy state than spins having an antiparallel magnetic moment. Resonant transitions between the energy levels can be excited through the irradiation of an alternating magnetic field of suitable strength which is oriented perpendicular to the external magnetic field referred to as the polarization field.

The resonant frequency or Larmor frequency $f_L$ required in order to excite the transitions is determined by the energy difference between the split levels, $$2\pi f_L = \gamma B_c,$$

where $\gamma$ indicates the gyromagnetic ratio of th spins involved, and $B_c$ designates the relevant characteristic magnetic field.

For authenticity assurance, not only nuclear spins but also electron spins are used as spin ensembles in security elements, correspondingly referred to in the case of resonant excitation as nuclear magnetic resonance (NMR) or electron spin resonance (ESR). Materials having a high electron spin density, in which the interaction of the spins with one another is no longer negligible, can also be used. These include ferromagnetic and ferrimagnetic materials, generally referred to in these cases as ferromagnetic resonance (FMR).

In NMR and ESR, the relevant characteristic magnetic field $B_c$ is essentially determined by the external magnetic field $B_0$, whereas, in FMR, the resonance condition also depends on internal fields present in the material which, together with the external magnetic field, form an effective field $B_{eff}$ which then represents the characteristic magnetic field $B_c$ relevant to the calculation of the resonant frequency.

With conventional magnetic field strengths, the resonant frequency in NMR is typically in the MHz range, whereas, in ESR and FMR, it is typically significantly higher in the GHz range.

The aforementioned spin resonances can be measured, for example, in a continuous-wave (CW) method in which a signal source is operated at a fixed excitation frequency $f_L$ which corresponds to the expected Larmor frequency of the spin resonance feature, and in which a parallel time-dependent modulation field is superimposed on the polarization field. Some spin resonance effects can also be measured in a pulsed method in which the occupancy states are manipulated by resonant single pulses or pulse sequences of the high-frequency signal. Further special methods can also be used, such as e.g. the rapid scan method, in which, with a substantially increased high-frequency field $B_1$, the polarization field $B_0$ is traversed so quickly that no saturation of the spin states occurs.

Irrespective of the measurement method that is used, the signal-to-noise ratio of a spin resonance measurement is always dominated by the first link in the high-frequency chain, i.e. by the resonator. The high-frequency signal S which is tappable at the resonator connection and is characteristic of the spin resonance is, in particular, proportional to the fill factor $\eta$ of the resonator, to the resonator quality Q and to the number of particles $N_S$ in the sensitive area, $$S \sim \eta * Q * N_S,$$

where the fill factor $\eta$ indicates the ratio of the magnetic field energy stored in the sample volume to the total magnetic field energy of the resonator stored in the space.

SUMMARY

Against this background, the object of the invention is to indicate an improved device for testing data carriers having spin resonance features, said device allowing, in particular, testing on fast-running data carriers using the CW method and/or using a pulsed method and/or using a rapid-scan method.

The invention provides a sensor element for the testing, in particular the authenticity testing, of a flat data carrier having a spin resonance feature. The flat data carrier can, for example, be a banknote. The sensor element comprises a magnetic core having an air gap into which the flat data carrier is insertable for the test, an element for generating a static magnetic flux in the air gap, and a resonator for exciting the spin resonance feature of the data carrier under test.

The sensor element preferably further comprises a modulation device for generating a modulated magnetic field parallel to the static magnetic flux in the air gap. This modulation can be performed, for example, at a frequency between around 1 kHz and around 1 MHz. This enables a spin resonance measurement having a good signal-to-noise ratio.

As a special characteristic, the resonator is formed by a microstrip line resonator which is arranged in the air gap of the magnetic core and which has a flat carrier with an upper side and an opposing lower side, and a conducting structure having a characteristic length l which is arranged on the upper side of the carrier.

The flat carrier preferably has a ground return on the upper side and/or the lower side. The ground return is preferably designed as a ground plane. The ground plane is preferably formed on the lower side of the carrier, thus enabling a more reliable measurement of the spin resonance signal, even in the presence of external interference signals.

In preferred designs, the microstrip line resonator forms a $\lambda/4$ fundamental mode, a $\lambda/2$ fundamental mode or a $\lambda$ fundamental mode. This means that the spatial extension of the field corresponds to one quarter or one half of the entire wavelength $\lambda$ of the injected high-frequency signal. A resonator having a $\lambda/4$ fundamental mode is advantageous if a small structural shape or size of the resonator is desired. The small size is accompanied by a spatially small $B_1$ distribution with simultaneously high spatial resolution and a low number of measured particles $N_S$. Conversely, a resonator having a $\lambda$ fundamental mode has a greater extension of the $B_1$ field, i.e. a lower spatial resolution, but a high number of measured particles $N_S$. A resonator having a $\lambda/2$ fundamental mode is a compromise between the two previously mentioned types.

As a conducting structure, the microstrip line resonator appropriately comprises a rectangular structure, an annular structure having a circular or elliptical outer contour, a disc-shaped structure, a ring-sector structure having circular or elliptical outer edges, or a structure having a triangular or polygonal shape. Rectangular, annular and disc-shaped structures are particularly preferred, since a defined resonance mode and therefore also a defined $B_1$ distribution can be excited in a simple manner within these structures. Conversely, alternative geometries can be advantageous with specific printed circuit board designs due to their small size. Combinations of the aforementioned elements can also be used as a conducting structure.

The microstrip line resonator with its characteristic length l is advantageously configured for testing the spin resonance feature of the data carrier in the spatial fundamental mode of the excitation field. This allows the microstrip line resonator to be particularly small in size. It has proven to be particularly advantageous if the microstrip line resonator with its characteristic length l is designed and configured for testing the spin resonance feature of the data carrier in a higher-order spatial mode of the excitation field, in particular the second-order or third-order mode of the excitation field. This enables a measurement in a larger sample volume and therefore an increase in the number $N_S$ of particles in the sensitive area.

In one advantageous embodiment, the microstrip line resonator has a quality Q between 50 and 400, in particular between 80 and 300.

The microstrip line resonator advantageously contains at least one signal conductor, to which the conducting structure is coupled. In one preferred embodiment, the microstrip line resonator comprises precisely one signal conductor and is operated in reflection mode. In a further preferred embodiment, the microstrip line resonator comprises precisely two signal conductors and is operated in transmission mode. The signal conductor(s) is/are preferably arranged on the upper side of the carrier, thereby simplifying the manufacture of the microstrip line resonator. In this case, the coupling of the signal conductor(s) is preferably implemented capacitively or via an inset feed. With the inset feed, the signal conductor and the resonator are, in particular, located on the same plane. However, the coupling point between the signal conductor and the resonator is preferably not located at the edge of the resonator, but inside the metallized copper area of the resonator. Unwanted signal reflections between the signal conductor and the resonator can be suppressed with a procedure of this type.

An arrangement of one or more signal conductors on the upper side of the carrier is also possible. In this case, an aperture coupling, for example, or a coaxial coupling can be used to couple the conducting structure to the signal conductor(s). The arrangement on the lower side enables low parasitic scattering losses and a signal coupling which is independent from the loading of the microstrip line resonator with a test item.

The resonator is preferably resonant in a frequency range between 1 GHz and 100 GHz. A frequency range between 5 GHz and 85 GHz, in particular between 15 GHz and 50

GHz, is particularly preferred. Compared with lower frequencies, this enables a higher spectral resolution and a stronger measurement signal.

The carrier of the microstrip line resonator is advantageously formed by a printed circuit board, thus allowing reproducible and low-cost manufacture. However, it is also advantageous, in particular for reducing dielectric losses in the carrier material, to use carriers based on ceramic, Teflon or hydrocarbons.

In one advantageous embodiment, the conducting structure of the microstrip line resonator is formed by a silver layer or by a conductor, for example made of copper, which is provided with a silver coating and a suitable protective layer. Due to the better conductivity of silver compared with copper, this enables a higher resonator quality Q. Since the current density is higher in the peripheral area of the signal conductor, the resonator quality can already be increased by a silver coating.

In a further advantageous embodiment, the conducting structure of the microstrip line resonator has a low surface roughness. A surface roughness Rq of less than 2.9 μm, particularly preferably less than 0.9 μm, in particular less than 0.4 μm, is preferred. The reduction in the surface roughness enables a high resonator quality Q.

In one advantageous development of the invention, the microstrip line resonator is arranged parallel in the air gap and distanced from a metallized shielding element in order to reduce radiation losses of the resonator. The shielding element advantageously has a carrier, for example a printed circuit board, which is provided with a metallization. This is advantageous from a manufacturing perspective. Furthermore, the printed circuit board can then also comprise the device for generating the modulation field, for example by means of planar coils. The microstrip line resonator and the shielding element appropriately form a narrow slot in which a transport path for the data carrier under test runs.

The spin resonance feature of the data carrier under test can be a nuclear spin resonance feature, an electron spin resonance feature or a ferromagnetic or ferrimagnetic resonance feature. The sensor element is particularly advantageously designed and configured for testing an electron spin resonance feature or a ferromagnetic or ferrimagnetic resonance feature, since particularly high resonant frequencies occur in said features.

The element for generating a static magnetic flux is advantageously formed by a permanent magnet. Compared with a structure in which the static component of the magnetic flux is generated by an electromagnet, this reduces energy consumption and waste heat. However, it can also be advantageous in other designs to generate not only a time-varying component, i.e. the modulation field, but also the static component of the magnetic flux in the air gap by means of electromagnets. Following the deactivation of the sensor element, this enables a particularly simple handling, particularly in the assembly, dismantling, and transport of the test device.

The invention also contains a test device for the testing, in particular the authenticity testing, of flat data carriers, in particular banknotes, having a sensor element of the type described. The test device also has a transport device which inserts the flat data carriers under test along a transport path into the air gap of the magnetic core or feeds them through the air gap of the magnetic core.

The transport device is particularly advantageously designed and configured for a fast-running transport, for example at a speed of 1 to 12 m/s of the flat data carriers under test, along the transport path.

The transport device is appropriately designed and configured to feed the flat data carriers under test along a transport path at a short distance above the upper side of the microstrip line resonator. A short distance is, in particular, a distance of several tenths of millimeters, preferably less than 0.5 mm. In this way, the flat data carriers, and therefore the spin resonance feature, traverse an area having a particularly strong excitation field above the microstrip line resonator, as a result of which a high fill factor $\eta$ is achieved.

In a further development of the invention, the sensor element of the test device is equipped with a shielding element of the aforementioned type, i.e. the microstrip line resonator is arranged in the air gap parallel to and distanced from a metallized shielding element in order to reduce radiation losses of the resonator. In a design of this type, the transport device of the test device is designed and configured to feed the flat data carriers under test along a transport path in a slot between the microstrip line resonator and the shielding element. This design enables a particularly high resonator quality Q.

In one advantageous design, the test device represents a set-up for a pulsed measurement and for this purpose has, in particular, a signal source for a pulsed activation of the microstrip line resonator. Compared with a CW application, a pulsed application offers the advantage that the decay behavior and the spectrum of a spin resonance feature can be measured more quickly.

In a further advantageous embodiment, the test device represents a set-up for a rapid-scan method and for this purpose has, in particular, a powerful signal source for activating the resonator, and a device for quickly traversing the polarization field strength. Compared with a CW application, a rapid-scan method offers the advantage that the spectrum of a spin resonance feature can be measured more quickly.

In contrast, a measurement in CW mode enables a particularly simple design of the electronics.

The test device can, in particular, be part of a banknote processing machine.

The invention also contains a method for the testing, in particular the authenticity testing, of a flat data carrier having a sensor element, in particular of the type described.

In the method, a flat data carrier having a spin resonance feature is tested by means of a sensor element. The following steps are carried out:

providing the flat data carrier;

feeding the flat data carrier into an air gap of a magnetic core of the sensor element;

exciting the spin resonance feature of the flat data carrier by means of a microstrip line resonator of the sensor element arranged in the air gap of the magnetic core;

capturing a measurement signal which is characteristic of the spin resonance feature by means of the microstrip line resonator; and testing the flat data carrier by means of the captured measurement signal.

In the method, the microstrip line resonator is preferably operated in a higher-order spatial mode of the excitation field, in particular the second-order or third-order mode of the excitation field. In a similarly advantageous method variant, the test is carried out with pulsed high-frequency excitation.

The features of the advantageous embodiments of the sensor element according to the invention are also valid for the method according to the invention. Conversely, the features of the advantageous embodiments of the method according to the invention are also valid for the sensor element according to the invention.

On the whole, the use according to the invention of a microstrip line resonator in the air gap of the magnetic core offers a range of advantages:

on one hand, the sensitive area of the microstrip line resonator can be loaded in a simple manner with a flat data carrier test item, for example a banknote. The sensitive area is also very readily accessible for the test item. In particular, banknotes can be transported automatically through the sensitive area of the resonator on a fast-running processing machine.

Due to its planar structure, the fill factor $\eta$ of a microstrip line resonator is particularly well adapted to flat test items, such as e.g. banknotes.

Since the number of particles $N_S$ in the measurement area is proportional to the resonator quality, the number $N_S$ can be increased by enlarging the resonator. If the enlargement is a multiple of the characteristic length l, and the resonator is therefore operated, in particular, in a higher-order mode, the resonant frequency is maintained, ignoring scattering effects.

In the case of microstrip line resonators, the quality Q is typically in the order of magnitude of 100, thus enabling very short rise times down to 100 ns, and even below 25 ns. The microstrip line resonator can therefore be quickly adjusted to the resonant frequency in the case of a measurement of fast-moving test items, and it further allows a pulsed measurement operation. The quality of the microstrip line resonator can also be further optimized, for example, via an additional shielding element, insofar as this is technically advantageous.

BRIEF DESCRIPTION OF THE DRAWINGS

Further exemplary embodiments and advantages are explained below with reference to the figures, the presentation of which, for the sake of greater clarity, is not true-to-scale or proportional.

In the figures:

FIG. 8 shows the measurement signal S of a microstrip line resonator and of a dielectric resonator depending on the strength of the polarization field $B_0$.

DETAILED DESCRIPTION OF VARIOUS EMBODIMENTS

Figure 1:
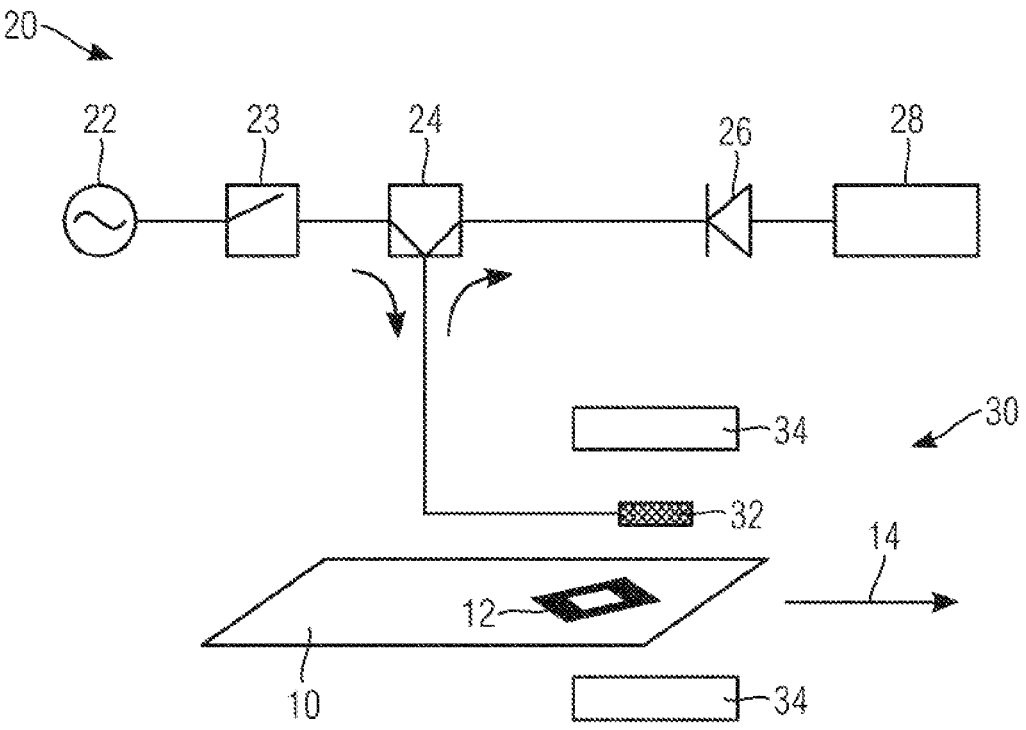
FIG. 1 shows schematically a test device for a pulsed operation with a fed-in banknote test item.

The invention will now be explained using the example of authenticity testing of banknotes. Quality control, for example, or a test for fitness for circulation can also be carried out with the method. For this purpose, FIG. 1 shows schematically a test device 20 of a banknote processing system for measuring spin residences in a banknote test item 10 in a pulsed set-up.

In one feature area, the banknote test item 10 has a spin resonance feature 12 under test, of which the characteristic properties serve to establish the authenticity of the banknote. For the authenticity test, the banknote test item 10 is fed along the transport path 14 through a sensor element 30 of the test device 20 which will be described more precisely below. The design according to the invention offers particular advantages in the testing of fast-running banknotes, wherein the banknote test items 10 are fed at high speed through the sensor element of the test device 20.

The test device 20 contains a signal source 22 and, in this example, a switch 23 for generating resonant single pulses or pulse sequences for the excitation of the spin resonance feature 12. The pulsed electrical excitation signal is fed via a duplexer 24 to a resonator 32 of the sensor element 30 which is located in the field of a polarization magnet 34, and generates a pulsed alternating magnetic field there. The response signal of the spin resonance feature 12 is captured by the resonator 32 in the pulse pauses and is fed via the duplexer 24 to a detector 26 and to an evaluation unit 28.

Figure 2:
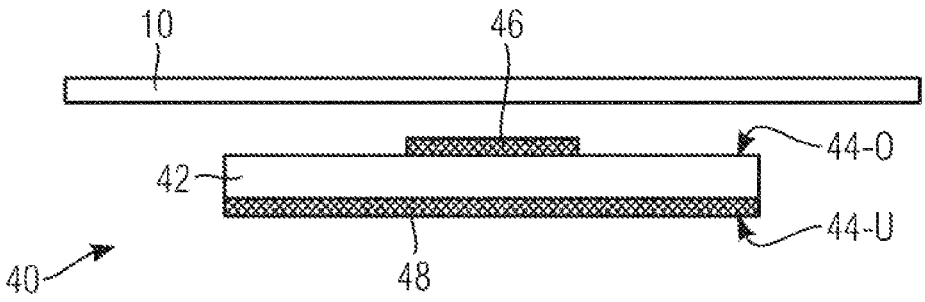
FIG. 2 shows schematically a microstrip line resonator loaded with a banknote test item in cross section, FIG. 3, including FIGS. 3(*a*) to 3(*c*), shows three specific embodiments of microstrip line resonators according to the invention, FIG. 4, including FIGS. 4(*a*) and 4(*b*), shows schematically a microstrip line resonator with a λ/2 fundamental mode, in 4(*a*) designed for operation in the fundamental mode, and in 4(*b*) designed for operation in the third-order mode.

As a special characteristic, the resonator 32 is formed by a microstrip line resonator which is arranged in the air gap of a polarization magnet with magnetic feedback. To provide a more detailed explanation, FIG. 2 shows schematically in cross section a design of a microstrip line resonator 40 of this type which is loaded with a banknote test item 10. Transport belts 16 which effect a transport of the banknote test item 10 in a transport direction 14 (not shown) running perpendicular to the image plane are further shown. Transport in a left-to-right direction is similarly possible with a different arrangement of the belts.

The microstrip line resonator 40 comprises a flat carrier 42 which, in the exemplary embodiment, is formed by a printed circuit board, but, in other designs, can also be formed, for example, by a ceramic material. The carrier 42 has an upper side 44-O facing the banknote test item 10 and an opposing lower side 44-U, wherein a conducting structure 46 having a characteristic length 1 is arranged on the upper side 44-O of the carrier, and a ground area 48 is arranged on the lower side 44-O as a ground return. For the sake of clarity, the signal conductor and the coupling of the conducting structure 46 are not shown in FIG. 2. A $B_1$ field shown in FIG. 2 forms with field lines along the plane of the banknote test item 10, here in a left-to-right direction. A characteristic of the field lines perpendicular to the image plane is similarly possible with a different arrangement of the resonator. The field lines of the $B_1$ field and the transport direction are perpendicular to one another in this example, but a parallel arrangement is similarly possible.

If the conductor path wavelength λ of the injected high-frequency signal matches the dimension 1 of the conducting structure 46 in the test, a standing wave can form in the resonator, and the microstrip line resonator 40 is in resonance with the excitation frequency associated with the wavelength λ.

FIG. 3 shows, in (a) to (c), three specific designs of suitable microstrip line resonators in a top view for illustrative purposes. The ground return is arranged in each case on the lower side (not visible) of the carrier.

The microstrip line resonator 50 shown in FIG. 3(a) forms a 24 fundamental mode. The conducting structure 52 is arranged on the upper side 44-O of a printed circuit board 42 and is formed by a rectangular structure 52 having a longitudinal dimension 1. The rectangular structure 52 is capacitively coupled on one side to the signal conductor 54 (reference sign 56) and the rectangular structure 52 is connected on the other side via a through-connection 58 to the ground return located on the lower side. The width of the rectangular structure 52 is determined by the conductor path width and is, for example, 1.8 mm. Other widths, for example in the range from 0.2 mm to 10 mm, are also possible. The resonator 50 shown in FIG. 3(a) is operated in reflection mode, and the resonant condition for the linear structure 52 is as follows:

$$1 = n * \lambda/4,$$

where n represents a mode factor which, in this embodiment, must be an odd whole number greater than or equal to 1. Depending on the effective permittivity of the set-up, the length I can, for example, be 14.9 mm for a resonant frequency of 3 GHZ, wherein, in this example, an effective permittivity of 2.78 has been chosen.

The microstrip line resonator 60 shown in FIG. 3(b) forms a 22 fundamental mode and has a conducting structure 62 having a characteristic length 1 which is arranged on the upper side 44-O of a printed circuit board and is coupled via an inset feed known per se to the signal conductor 54. The resonator 60 shown in FIG. 3(b) is operated in reflection mode, wherein the resonance condition for the conducting structure 62 is:

$$1 = n * \lambda/2,$$

with a mode factor n which, in this case, represents a whole number greater than or equal to 1. The length 1 can, for example, be 29.9 mm for a resonant frequency of 3 GHz and an effective permittivity of 2.78. An effective permittivity of 2.02 and a resonant frequency of 20 GHz produce a characteristic length 1 of 5.3 mm.

The microstrip line resonator 70 shown in FIG. 3(c) forms a λ fundamental mode and has a conducting annular structure 72 arranged on the upper side 44-O of a printed circuit board which is capacitively coupled to the signal conductor 74. The characteristic length 1 of the annular structure 72 is determined by its circumference $1 = 2\pi r$, with the annular radius r to the center of the conductor path. The resonator 70 shown in FIG. 3(c) is operated in transmission mode, wherein the resonance condition of the conducting structure 72 is:

$$1 = 2\pi r = n * \lambda,$$

with a mode factor n which represents a whole number greater than or equal to 1. With a resonant frequency of 3 GHZ, for example, the conductor path is 1.8 mm wide and has a circumference of 59.7 mm.

The microstrip line resonators are designed, in particular, so that their resonant frequency f corresponds to the expected Larmor frequency $f_L$ of the spin resonance feature under the predefined measurement conditions. In the case of the resonator shown in FIG. 3(b), for example, the characteristic length 1 for a resonant frequency f is determined by:

$$1 = n * c/(2 * f * \sqrt{\varepsilon_{eff}}) - \Delta l,$$

where $\varepsilon_{eff}$ represents the effective permittivity of the set-up, c the speed of light, and $\Delta l$ a length correction known per se for taking account of electrical stray areas at the edge of the resonator. If the expected Larmor frequency $f_L$ of the spin resonance feature is chosen in the indicated relationship for f, the characteristic length 1 of the conducting structure 62 suitable for the test is obtained.

The geometric shapes of the conducting structures 52, 62, 72 shown in FIG. 3 are obviously shown only by way of example. Not only rectangular and annular structures, but also disc-shaped structures, for example, having a round or elliptical outer contour, rings having elliptical outer edges, ring sectors and elements having a fundamental rectangular or polygonal shape can also be considered as conducting structures. Combinations of such basic elements are also possible. For conducting structures with more complex designs, no closed analytical formulae normally exist for the dependence of the characteristic length on the resonant frequency, but the suitable characteristic length for a desired resonant frequency can readily be determined with the aid of a simulation tool.

A capacitive coupling and a coupling via an inset feed are illustrated as coupling mechanisms in FIG. 3. The possibility of coupling the conducting structure via an aperture coupling or a coaxial coupling also exists. Furthermore, along with the variant shown in FIG. 3 for coupling the conducting structures in series to the signal conductor, particularly in the case of a microstrip line resonator operated in transmission mode, the possibility of implementing the coupling in parallel to the signal conductor also exists. This means that the signal conductor is not interrupted by the resonator. Instead, the resonator is located near to the signal conductor, and a coupling then takes place through cross-talk of the high-frequency signal from the signal conductor into the resonator.

The high fill factor of the microstrip line resonator that is advantageous for the application in the case of banknote testing is obtained, in particular, from the spatial distribution of the $B_1$ field which is particularly well adapted to the geometry of a banknote or other flat data carrier, and which is strongest on the upper side of the resonator and decreases substantially as the distance from the resonator increases (see FIGS. 6(*b*), 7(*b*) below). As illustrated in FIG. 2, a field distribution of this type is optimally filled by a banknote test item 10 in its measurement position, so that a high fill factor $\eta$ and therefore a high signal strength are obtained in the measurement.

It is also clear from the representation shown in FIG. 2 that the area covered by the conducting structure 46 in a test item 10, and therefore the number $N_S$ of measured particles also, are proportional to the characteristic area of the conducting structure. Since the required resonant frequency of the microstrip line resonator is essentially predefined by the Larmor frequency $f_L$ of the substance under test, the characteristic length l of the conducting structure cannot be freely chosen. In order to measure a large number $N_S$ of particles, a microstrip line resonator having a higher-order mode of the excitation field can be set up.

In this respect, FIG. 4 illustrates schematically in (a) a $\lambda/2$ microstrip line resonator 80 having a conducting structure 82 which is designed for operation in the fundamental mode n=1 for a predefined Larmor frequency $f_L$ and which correspondingly has a specific characteristic length $l_1$. The $\lambda/2$ microstrip line resonator 90 shown in FIG. 4(*b*) is designed for the same Larmor frequency $f_L$, but for operation in the third-order mode n=3. At the same resonant frequency $f_L$, the characteristic length $l_3$ of the conducting structure 92 is therefore three times as long as the characteristic length $l_1$ of the conducting structure 82 shown in FIG. 4(*a*).

The associated characteristic of the respectively generated $B_1$ field (curve 84 or 94) is shown schematically in each case below the microstrip line resonators 80, 90. As is immediately evident, the surface area of a test item 10 covered with the resonator 80 shown in FIG. 4(*a*) can be three times greater than with the resonator 80 shown in FIG. 4(*b*), and therefore a threefold number $N_S$ of particles can ideally be measured. A further increase in the number $N_S$ of particles can be achieved in some cases by widening the conducting area 82, 92 while the length remains constant.

The quality Q of a microstrip line resonator according to the invention is typically around 100 and is therefore significantly below the typical quality of a cavity resonator. According to current understanding, the lower quality is based above all on the fact that the electromagnetic oscillations of the microstrip line resonators are present primarily in the conducting structure openly applied to the carrier. Metallic losses occur here in the material of the conducting structure (for example copper), dielectric losses in the carrier material (for example FR4 materials), and also radiation losses due to antenna effects which result in each case in attenuation and therefore reduced resonator quality.

However, it has surprisingly become clear that a quality in the range from around Q=50 to around Q=400 for spin resonance measurements on fast-running data carriers does not represent a disadvantage, but, on the contrary, is even associated with a plurality of advantages.

On one hand, as already explained in detail above, a lower quality for measurements on fast-moving samples and for pulsed methods is essentially advantageous, since a high resonator quality is always associated with a long rise time of the resonator. However, the quality must not be too low, since signal intensity rises proportionally with quality. The optimum quality of a resonator for measurement on fast-moving samples is therefore obtained from a careful balancing of the two factors of signal intensity and time constant, and it has become evident that quality in the order of magnitude of 100 represents a good compromise between the two opposing requirements for the purpose according to the invention.

In addition, the quality of the microstrip line resonator can be optimized within the framework of the required measurement dynamics by a plurality of measures. Metallic losses can be reduced through the choice of material for the conducting structure, for example by forming the conductor from silver rather than copper. A silver coating of the conductor is often sufficient at the high operating frequencies due to the skin effect. Quality can furthermore also be increased by using conductor structures having a low surface roughness. Suitable materials can be used for the carrier of the microstrip line resonator, for example based on ceramic, Teflon or hydrocarbons, in order to reduce dielectric losses.

Figure 5:
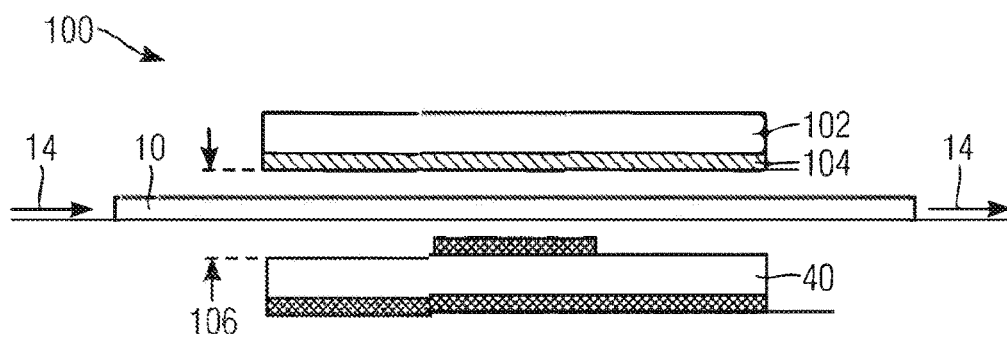
FIG. 5 shows the microstrip line resonator similar to FIG. 2 together with a shielding element, FIG. 6, including FIGS. 6(*a*) and 6(*b*), shows simulated $B_1$ field distributions of a microstrip line resonator with a rectangular conducting structure, FIG. 7, including FIGS. 7(*a*) and 7(*b*), shows simulated $B_1$ field distributions of a microstrip line resonator with an annular conducting structure.

Radiation losses can finally be reduced, for example, by a shield, as illustrated in FIG. 5. The figure shows a microstrip line resonator 40 similar to FIG. 2, combined with a shielding element 100 which is formed by a printed circuit board 102 having a metallization 104. The microstrip line resonator 40 and the shielding element 100 define a slot 106 between them in which the transport path 14 of the banknote test item 10 runs. The good banknote accessibility of the sensitive resonator area is therefore not impeded by the shielding element 100.

Figure 6:
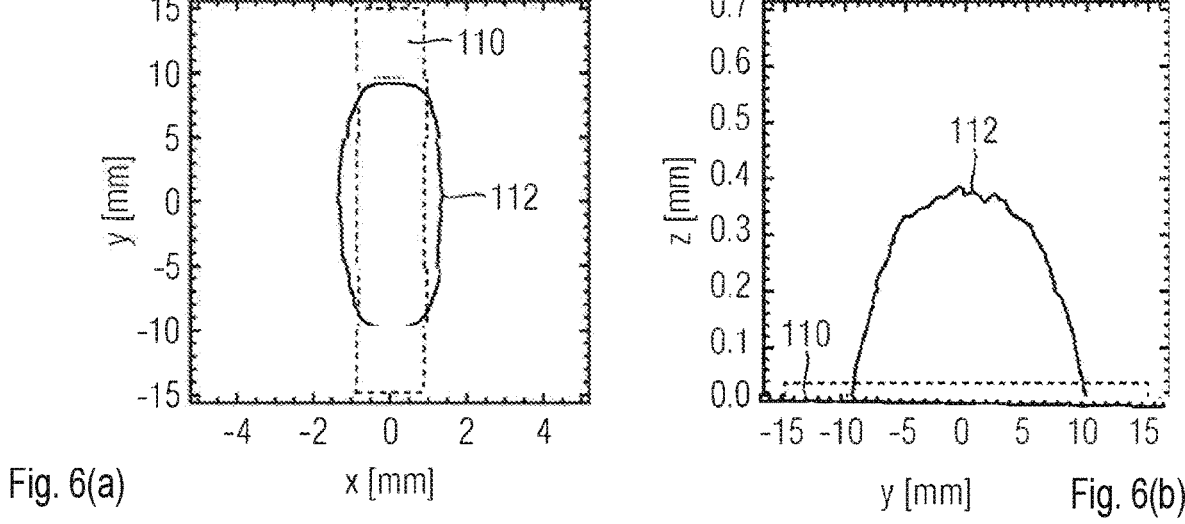

FIGS. 6 and 7 illustrate the advantageous $B_1$ field distribution of two microstrip line resonators according to exemplary embodiments of the invention.

A first microstrip line resonator has a rectangular conducting structure 110 having a width of 1.8 mm and a length of 29.9 mm. The resonator is implemented on a 0.81 mm thick printed circuit board having a relative permittivity of 3.55, resulting in an effective permittivity of 2.78 for the set-up. The first microstrip line resonator has a resonant frequency of around 3 GHZ and is operated in the fundamental mode n=1. In the alignment, it has been assumed that the microstrip line resonator is centered in the x-y plane. FIG. 6 shows the geometry of the conducting structure 110 and the field distribution of the fundamental mode calculated with a simulation tool on the basis of the 50% contour line 112 which demarcates the area of the magnetic field in which the $B_1$ strength attains more than 50% of the global maximum value. FIG. 6(*a*) shows the geometry and field distribution in the x-y plane at z=0.035 mm, i.e. on the upper side of the microstrip line resonator, and FIG. 6(*b*) shows the geometry and field distribution in the y-z plane at x=0, i.e. along the longitudinal axis of the microstrip line resonator.

A second microstrip line resonator contains an annular structure having a conductor path width of 1.8 mm and a circumference of 59.7 mm in center of the conductor path as the conducting structure 120. The resonator is implemented on a printed circuit board with the same specifications as the resonator shown in FIG. 6. This microstrip line resonator also has a resonant frequency of around 3 GHz and is operated in the fundamental mode n=1. FIG. 7 shows the geometry of the conducting structure 120 and the calculated field distribution of the fundamental mode on the basis of the 50% contour line 122. FIG. 7(*a*) shows the geometry and field distribution in the x-y plane at z=0.035 mm, i.e. on the upper side of the microstrip line resonator, and FIG. 7(*b*) shows the geometry and field distribution in the x-z plane at y=0, i.e. along the axis of the signal conductors.

As is immediately evident from FIGS. 6(*b*) and 7(*b*), the $B_1$ field of the conducting structures 110, 120 is concentrated in each case on the upper side of the resonators and then quickly decreases over a few tenths of millimeters as the distance in the z-direction increases. The $B_1$ field of a distribution of this type is very readily accessible for a banknote test item 10.

The fill factor η of the resonators has been calculated on the basis of the calculated field distributions in order to quantify this accessibility. Along with the two resonators already described in connection with FIGS. 6 and 7, a third microstrip line resonator has been incorporated into the calculation, having a rectangular conducting structure with a width of 1.8 mm and a length of 59.8 mm and being implemented on a printed circuit board with the same specifications as the resonator shown in FIG. 6. The third resonator similarly has a resonant frequency of around 3 GHz and is operated in the second-order mode n=2.

A conventional dielectric resonator having a cylindrical geometry with an outer diameter of 17.9 mm, an inner diameter of 5.5 mm, a height of 10.6 mm and a relative permeability of 37 serves as a comparative example.

For the comparison, it has been assumed in each case that the resonators are loaded with a 100 μm thick banknote test item which, in the case of the microstrip line resonators, is arranged directly on the upper side of the resonators, and, in the case of the dielectric resonator, on the circular base area of the cylinder. The area content $A_{50}$, which indicates the area inside a 50% contour of the $B_1$ distribution, serves as a measure for the number $N_S$ of respectively measured particles. This area content has been determined twice, i.e. once (referred to below as $A_{50}$, loc) for a $B_1$ distribution which is normalized onto its local maximum in the plane of the banknote test item, and once (referred to below as $A_{50}$, glob) for a $B_1$ distribution which is normalized onto its global maximum within the total volume.

TABLE 1

| | η (%) | $A_{50,\ loc}$ (mm²) | $A_{50,\ loc}$ (mm²) |
|---|---|---|---|
| | summarizes the calculated fill factors and area contents for the four resonators: | | |
| Rectangular resonator (n = 1) | 5.5 | 50 | 43 |
| Rectangular resonator (n = 2) | 5.7 | 95 | 85 |
| Annular resonator (n = 1) | 5.4 | 101 | 94 |
| Dielectric resonator (comparative example) | 0.2 | 168 | 0 |

As shown in the table, the microstrip line resonators, when used in the measurement of spin resonance features of flat data carriers, have an at least 27 times higher fill factor η than the dielectric resonator used as a comparative example.

In addition, the calculated $A_{50}$ area contents prove that the number $N_S$ of examined particles can be increased by increasing the resonator mode. The rectangular resonator with n=2 has almost double the $A_{50}$ area of the rectangular resonator in the fundamental mode with n=1.

A comparison of the local and global $A_{50}$ areas for each of the resonators reveals that the banknote test item in the microstrip line resonators is located in each case in an area with an almost maximum B field ($A_{50,\ glob}$~$A_{50,\ loc}$), whereas the banknote test item in the dielectric resonator is located only in a weak peripheral area of the generated field ($A_{50,\ glob}$~0).

Finally, for an experimental verification, a paper sample with a spin marker was loaded and the spin resonance spectrum of the marker in the paper sample was then recorded over a $B_0$ sweep. The $B_0$ field pointed parallel to the z-axis. The measurement was carried out with two different resonators.

In a first measurement, a microstrip line resonator according to the invention was used which had a conducting structure having a rectangular geometry with a length of 40 mm and a width of 2.3 mm. The conducting structure was arranged on a printed circuit board having a thickness of 0.5 mm and a relative permittivity of 2.33, and therefore in a set-up with an effective permittivity of 2.02. The microstrip line resonator had a resonant frequency of 2.6 GHz, a quality of Q=104 and was aligned so that it was located in the x-y plane perpendicular to the $B_0$ direction.

In a second measurement, a conventional dielectric resonator was used as a comparative example, the parameters of which corresponded to the parameters described above for the simulation. The known dielectric resonator had a resonant frequency of 3.0 GHz and a quality of 800. Due to the geometry of the known dielectric resonator, only the stray components of the $B_1$ field could be used to measure the paper sample. The known dielectric resonator was therefore aligned so that its cylinder axis pointed parallel to the z-axis. Due to the slightly higher resonant frequency, a spin resonance was expected to occur in the measurement with the dielectric resonator with a $B_0$ field that was roughly 15% higher than with the microstrip line resonator according to the exemplary embodiment of the invention.

In the experiment, the paper sample was laid directly onto the upper side of the respective resonators in the x-y plane. The results of the two measurements are summarized in the diagram 130 shown in FIG. 8 which shows the measurement signal S of the microstrip line resonator (curve 132) and of the dielectric resonator (curve 134) depending on the strength of the polarization field $B_0$.

The diagram in FIG. 8 clearly shows that only the microstrip line resonator according to the invention, but not the dielectric resonator, captures a spin resonance signal. The advantageous influence of the higher fill factor η therefore clearly dominates the lower quality Q of the microstrip line resonator and results in an improved detection.

The invention claimed is:

1. A sensor element for testing a flat data carrier, comprising:

a magnetic core having an air gap into which the flat data carrier is insertable for the test, an element for generating a static magnetic flux in the air gap, and a resonator for exciting a spin resonance feature of the data carrier under test, wherein the resonator is formed by a microstrip line resonator which is arranged in the air gap of the magnetic core and which has a flat carrier with an upper side and an opposing lower side, wherein a conducting structure having a characteristic length l is arranged on the upper side, wherein the microstrip line resonator is designed for excitation of spin resonance signals having a frequency between 1 GHz and 100 GHz.

2. The sensor element according to claim 1, wherein the carrier has a ground area arranged on the lower side.

3. The sensor element according to claim 1, wherein the microstrip line resonator forms a λ/4 fundamental mode, a λ2 fundamental mode or a λ fundamental mode.

4. The sensor element according to claim 1, wherein the microstrip line resonator as a conducting structure comprises a rectangular structure, an annular structure having a circular or elliptical outer contour, a disc-shaped structure, a ring-sector structure having round or elliptical outer edges, or a structure having a triangular or polygonal shape.

5. The sensor element according to claim 1, wherein the microstrip line resonator with its characteristic length l is designed and configured for testing the spin resonance feature of the data carrier in a higher-order spatial mode of an excitation field.

6. The sensor element according to claim 1, wherein the microstrip line resonator has a quality Q between 50 and 400.

7. The sensor element according to claim 1, wherein the microstrip line resonator is arranged in the air gap parallel to and distanced from a metallized shielding element in order to reduce radiation losses of the resonator.

8. The sensor element according to claim 1, wherein the sensor element is designed and configured for testing an electron spin resonance feature or a ferromagnetic or ferrimagnetic resonance feature.

9. A test device for testing flat data carriers having a sensor element according to claim 1 and having a transport device which inserts the flat data carriers under test along a transport path into the air gap of the magnetic core or feeds them through the air gap of the magnetic core.

10. The test device according to claim 9, wherein the transport device is designed and configured for a fast-running transport of the flat data carriers under test along the transport path.

11. The test device according to claim 9, wherein the transport device is designed and configured to feed the flat data carriers under test along a transport path at a short distance above the upper side of the microstrip line resonator.

12. The test device according to claim 9, wherein the sensor element is equipped with a shielding element, and the transport device is designed and configured to feed the flat data carriers under test along the transport path in a slot between the microstrip line resonator and the shielding element.

13. The test device according to claim 9, wherein the test device has a signal source for a pulsed activation of the microstrip line resonator and/or for an operation of the microstrip line resonator using a rapid-scan method and/or using a CW method.

14. The sensor element according to claim 1, wherein the microstrip line resonator with its characteristic length l is designed and configured for testing the spin resonance feature of the data carrier in a second-order or third-order mode of an excitation field.

15. A method for testing a flat data carrier having a spin resonance feature by means of a sensor element, in which the following steps are carried out:

providing the flat data carrier;

feeding the flat data carrier into an air gap of a magnetic core of the sensor element;

exciting the spin resonance feature of the flat data carrier by means of a microstrip line resonator of the sensor element arranged in the air gap of the magnetic core;

capturing a measurement signal which is characteristic of the spin resonance feature by means of the microstrip line resonator; and testing the flat data carrier by means of the captured measurement signal, wherein the microstrip line resonator is designed for excitation of spin resonance signals having a frequency between 1 GHz and 100 GHz.

* * * * *